(12) United States Patent
Pun et al.

(10) Patent No.: US 11,764,392 B2
(45) Date of Patent: Sep. 19, 2023

(54) BATTERY ASSEMBLY AND METHOD OF MANUFACTURING THE SAME

(71) Applicant: ANALOG DEVICES, INC., Norwood, MA (US)

(72) Inventors: Kelvin Po Leung Pun, Hong Kong (HK); Vikram Venkatadri, Ayer, MA (US); David Frank Bolognia, Charlestown, MA (US); Chee Wah Cheung, Hong Kong (HK)

(73) Assignee: ANALOG DEVICES, INC., Norwood, MA (US)

( * ) Notice: Subject to any disclaimer, the term of this patent is extended or adjusted under 35 U.S.C. 154(b) by 404 days.

(21) Appl. No.: 15/909,849

(22) Filed: Mar. 1, 2018

(65) Prior Publication Data

US 2019/0273280 A1    Sep. 5, 2019

(51) Int. Cl.
| | |
|---|---|
| *H01M 10/0585* | (2010.01) |
| *H01M 10/04* | (2006.01) |
| *H01M 4/66* | (2006.01) |
| *H01M 4/04* | (2006.01) |
| *H01M 50/55* | (2021.01) |
| *H05K 3/32* | (2006.01) |

(52) U.S. Cl.
CPC ..... *H01M 10/0436* (2013.01); *H01M 4/0407* (2013.01); *H01M 4/0414* (2013.01); *H01M 4/667* (2013.01); *H01M 10/0585* (2013.01); *H01M 50/55* (2021.01); *H05K 3/321* (2013.01)

(58) Field of Classification Search
CPC ............. H01M 10/00; H01M 10/0431; H01M 10/0436; H01M 10/045; H01M 10/0459; H01M 10/0585; H01M 50/105; H01M 50/647; H01M 50/178; H01M 50/553
See application file for complete search history.

(56) References Cited

U.S. PATENT DOCUMENTS

| | | |
|---|---|---|
| 3,023,259 A | 2/1962 | Coler et al. |
| 5,244,754 A | 9/1993 | Bohmer et al. |
| 5,415,949 A | 5/1995 | Stone et al. |

(Continued)

FOREIGN PATENT DOCUMENTS

| | | |
|---|---|---|
| CN | 1462082 A | 12/2003 |
| CN | 101411021 A | 4/2009 |

(Continued)

OTHER PUBLICATIONS

Gaikwad et al., "Highly Flexible, Printed Alkaline Batteries Based on Mesh-Embedded Electrodes." Advanced Materials 23.29, 2011, pp. 3251-3255.

(Continued)

*Primary Examiner* — James Lee
(74) *Attorney, Agent, or Firm* — Knobbe, Martens, Olson & Bear LLP (57) ABSTRACT

A battery assembly is disclosed. The battery assembly can include a first electrode disposed in a first substrate section and a second electrode disposed in a second substrate section. The battery assembly can also include an adhesive that bonds the first substrate section to the second substrate section. The adhesive partially defines a chamber between the first and second electrodes. The battery assembly can also include an electrolyte disposed in the chamber between the first and second electrodes.

20 Claims, 6 Drawing Sheets

(56) References Cited

U.S. PATENT DOCUMENTS

| | | | |
|---|---|---|---|
| 5,439,758 A | 8/1995 | Stone et al. | |
| 5,650,241 A | 7/1997 | McGee | |
| 5,665,490 A * | 9/1997 | Takeuchi | C08G 65/33348 29/25.03 |
| 6,319,630 B1 * | 11/2001 | Hasegawa | H01M 50/116 429/162 |
| 6,967,362 B2 | 11/2005 | Nam et al. | |
| 7,624,499 B2 | 12/2009 | Stole | |
| 8,361,644 B2 | 1/2013 | Kane et al. | |
| 9,472,814 B1 * | 10/2016 | Berland | B23K 26/38 |
| 9,601,278 B2 | 3/2017 | Jiang et al. | |
| 2006/0127756 A1 * | 6/2006 | Seo | H01M 10/425 429/175 |
| 2007/0264564 A1 | 11/2007 | Johnson et al. | |
| 2011/0274959 A1 | 11/2011 | Bailey et al. | |
| 2012/0276434 A1 | 11/2012 | Gaikwad et al. | |
| 2013/0071696 A1 * | 3/2013 | Kim | H01M 50/116 429/7 |
| 2013/0083496 A1 | 4/2013 | Franklin et al. | |
| 2013/0101894 A1 * | 4/2013 | Baba | H01M 50/10 429/164 |
| 2013/0189561 A1 * | 7/2013 | Kim | H01M 50/486 429/144 |
| 2013/0252065 A1 * | 9/2013 | Ueda | H01M 50/116 429/127 |
| 2013/0309536 A1 | 11/2013 | Wu | |
| 2015/0136301 A1 * | 5/2015 | Cyman, Jr. | C08K 5/01 156/60 |
| 2015/0288024 A1 * | 10/2015 | Andry | H01M 10/0436 429/188 |
| 2016/0064149 A1 | 3/2016 | Jiang et al. | |
| 2016/0104581 A1 | 4/2016 | Jiang et al. | |
| 2016/0104913 A1 * | 4/2016 | Moreau | H01M 10/0525 429/152 |
| 2016/0111705 A1 | 4/2016 | Kisdarjono et al. | |
| 2016/0204492 A1 | 7/2016 | Jiang et al. | |
| 2016/0226542 A1 | 8/2016 | Tran et al. | |
| 2016/0322611 A1 | 11/2016 | Kang et al. | |
| 2017/0005504 A1 | 1/2017 | Rho et al. | |
| 2017/0179517 A1 * | 6/2017 | Stalder | H01M 10/0525 |
| 2017/0222254 A1 | 8/2017 | Sakamoto et al. | |
| 2019/0104613 A1 * | 4/2019 | Zargar | G06K 19/0717 |

FOREIGN PATENT DOCUMENTS

| | | |
|---|---|---|
| CN | 201966261 U | 9/2011 |
| CN | 102800727 A | 11/2012 |
| CN | 103827771 A | 5/2014 |
| CN | 104752438 A | 7/2015 |
| CN | 105765008 A | 7/2016 |
| CN | 107017414 A | 8/2017 |
| CN | 107210136 A | 9/2017 |
| JP | 2012252842 A | 12/2012 |
| KR | 10-2015-0016897 | 2/2015 |
| KR | 10-2016-0032992 | 3/2016 |
| KR | 10-2016-0048689 | 5/2016 |
| KR | 10-2016-0052426 | 5/2016 |
| WO | WO 2012/025505 A1 | 3/2012 |
| WO | WO 2013/136181 | 9/2013 |
| WO | WO 2016/204050 | 12/2016 |

OTHER PUBLICATIONS

Kwon et al., "Cable-Type Flexible Lithium Ion Battery Based on Hollow Multi-Helix Electrodes" Advanced Materials, Jul. 2012 in 6 pages.

Pushparaj et al. "Flexible Energy Storage Devices Based on Nanocomposite Paper." Proceedings of the National Academy of Sciences, vol. 104, No. 34, Aug. 21, 2007, pp. 13574-13577.

Xu, et al., "Stretchable Batteries with Self-Similar Serpentine Interconnects and Integrated Wireless Recharging Systems," Nature Communications, 2013 in 36 pages.

Zhou et al., "Progress in Flexible Lithium Batteries and Future Prospects." Energy & Environmental Science, vol. 7, 2014, pp. 1307-1338.

Braam, Kyle, "Development of an air-stable, high energy density printed silver oxide battery for printed electronics," PhD Thesis, UC Berkeley (2014).

International Search Report and Written Opinion issued in application No. PCT/US2019/019755 dated Jun. 10, 2019.

Office Action for CN201980016563.0, dated October 8, 20222.

Office Action received in CN 201980016563.0, dated Apr. 1, 2022.

\* cited by examiner

BATTERY ASSEMBLY AND METHOD OF MANUFACTURING THE SAME

BACKGROUND

Field

The field relates to battery assemblies, and in particular, to thin battery assemblies and methods of manufacturing the same.

Description of the Related Art

Batteries are often used for electronic devices that are not powered by a wired cord or other electrical connection. Many conventional batteries are relatively large, and may increase the overall size of the electronic device or system. It may be difficult to integrate such large batteries into electronic devices. Therefore, with the miniaturization of electronic devices, there is a strong demand for thin batteries that can improve the use of space in electronic devices.

SUMMARY

In one aspect, a battery assembly is disclosed. The battery assembly includes a first electrode disposed in a first substrate section and a second electrode disposed in a second substrate section. The battery assembly also includes an adhesive that bonds the first substrate section to the second substrate section. The adhesive partially defines a chamber between the first and second electrodes. The battery assembly further includes an electrolyte disposed in the chamber between the first and second electrodes.

In some embodiment, the battery assembly further includes a first current collector that is configured to collect current from the first electrode and a second current collector that is configured to collect current from the second electrode.

In some embodiments, the first current collector comprises a first terminal and the second current collector comprises a second terminal. The first and second terminals are configured to connect to an electronic device.

In some embodiments, the first substrate section is formed on a flexible substrate.

In some embodiments, the first and second substrate sections comprise respective portions of a single substrate. The single substrate is folded between the first and second substrate sections.

In some embodiments, the first substrate section forms part of a first substrate and the second substrate section forms part of a separate second substrate. In some embodiments, the battery assembly further includes a via that extends through the first and second substrates and the adhesive. The via guides current from the second electrode to a different portion of the battery assembly.

In some embodiments, the battery assembly further includes a package substrate assembly that has one or more conductive traces. The battery assembly is integrated within the package substrate assembly and electrically connected to a first conductive trace of the one or more conductive traces. In some embodiments, the battery assembly further comprises an integrated device die that is mounted and electrically connected to the package substrate assembly.

In some embodiments, the electrolyte is screen printed in the chamber.

In some embodiments, the adhesive and the electrolyte are spaced by a spacer.

In some embodiments, the battery assembly has a thickness from a top surface to a bottom surface in a range of 50 microns to 500 microns.

In one aspect, a package substrate assembly is disclosed. The package substrate assembly can include a first layer that comprises a first electrode and a first current collector that is configured to collect current for the first electrode. The package substrate assembly can also include a second layer that comprises a second electrode and a second current collector that is configured to collect current for the second electrode. The package substrate assembly can further include an electrolyte layer that comprises an electrolyte and an adhesive. The electrolyte layer is disposed between the first and second layers. The adhesive, the first layer and the second layer at least partially define a chamber that receives the electrolyte.

In one aspect, a method of manufacturing a battery assembly is disclosed. The method includes forming first and second cavities in respective first and second substrate sections and disposing first and second electrodes in the respective first and second cavities. The method also includes, adhering the first and second substrate sections with an adhesive. The method further includes providing an electrolyte in a chamber that is defined by the adhesive.

In some embodiments, the first and second substrate sections comprise part of a single substrate. In some embodiments, the adhering the first and second substrate sections comprises folding the first and second substrate sections relative to one another.

In some embodiments, the method further includes disposing a protective layer that at least partially covers the battery assembly.

In some embodiments, the providing the electrolyte in the chamber comprises screen-printing the electrolyte in the chamber.

In some embodiments, adhering the first and second substrate sections comprises providing the adhesive on at least a portion of the first substrate section.

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale.

BRIEF DESCRIPTION OF THE DRAWINGS

Specific implementations of the invention will now be described with reference to the following drawings, which are provided by way of example, and not limitation.

DETAILED DESCRIPTION

Batteries are important power sources for many electrical or electronic devices used in everyday life today. For example, among other things, watches, mobile computing devices (including, e.g., mobile smartphones, tablet computing devices, etc.), remote control devices, and wearable health products (e.g., hearing aids, biometric sensors such as vital sign monitoring devices, etc.) use batteries to supply power to the electrical and/or electronic components within the devices. However, many conventional batteries are relatively large, making it difficult to integrate conventional batteries into the electronic device without substantially increasing the size of the device. Accordingly, with the miniaturization of electronic devices, there is a strong demand for batteries that can fit into a space in such electronic devices. Moreover, there remains a continuing demand to be able to manufacture thin batteries using efficient assembly techniques.

Figure 1:
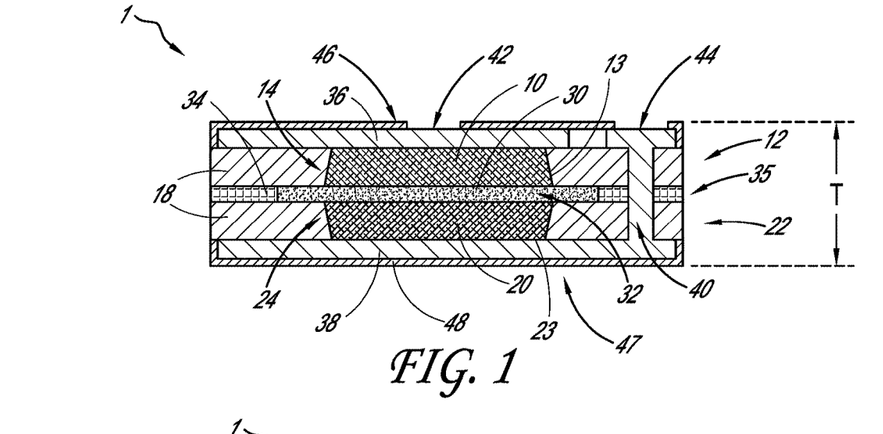
FIG. 1 is a schematic cross-sectional view of a battery assembly, according to one embodiment.
Figure 2:
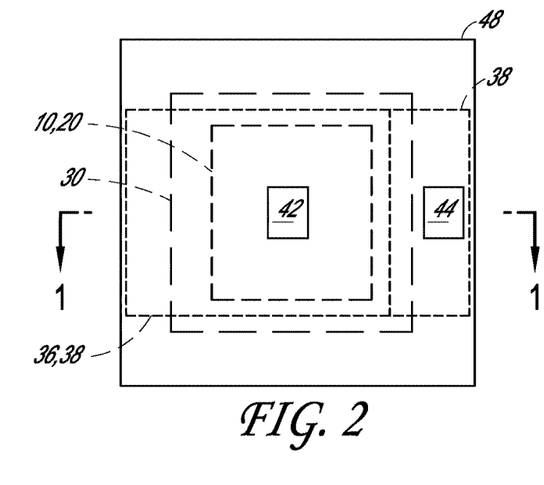
FIG. 2 is a schematic top plan view of the battery assembly of FIG. 1.

FIG. 1 is a schematic cross-sectional view of a battery assembly 1, according to one embodiment. FIG. 2 is a schematic top plan view of the battery assembly 1 of FIG. 1 with a first electrode material 10, a second electrode material 20, an ionically conductive material 30, a first current collector 36, a second current collector 38, and a protective layer 48, illustrated with hidden lines (a non-conductive material 18 is not shown). The embodiment shown in FIGS. 1-2 beneficially integrates the battery assembly 1 into first and second substrate sections 14, 24 of respective first and second substrates 12, 22. Integrating battery assembly 1 into the relatively thin substrates 12, 22 can beneficially form thin batteries, as compared to the overall thickness of the package. As shown in FIG. 1, the battery assembly 1 can include the first electrode material 10 disposed in a first cavity 13 formed in the first substrate section 14 of the first substrate 12 and the second electrode material 20 disposed in a second cavity 23 in the second substrate section 24 of the second substrate 22. The first and second substrates 12, 22 can comprise a non-conductive material 18 with embedded conductive traces and/or contacts. In various embodiments, the substrates 12, 22 can comprise flexible substrates that can bend to conform to a desired geometry. For example, in various embodiments, the non-conductive material 18 can comprise a polymer (e.g., polyimide) with embedded conductors for routing electronic signals. In the illustrated embodiment, the portions of the substrate sections 14, 24 used to define the battery assembly 1 may each comprise a single conductor to act as current collectors, as explained herein.

The first and second electrode materials 10, 20 can be separated by the ionically conductive material 30 to at least partially define the battery. The ionically conductive material 30 can be disposed in a chamber 32 at least partially defined by an adhesive 34 that is used to attach the first and second substrate sections 14, 24 to one another. The battery assembly 1 of FIG. 1 can also include the first current collector 36 configured to collect current from the first electrode material 10, the second current collector 38 configured to collect current from the second electrode material 20, and a via 40 electrically connected to the second current collector 38. The first current collector 36 can have a first terminal 42 on a top surface 46 of the battery assembly 1 and the via 40 can have a second terminal 44 on the top surface 46 of the battery assembly 1. Thus, current from the first and second electrode materials 10, 20 can be accessed on the top surface 46 allowing easier connections with an external device, in some embodiments. However, it should be appreciated that the second terminal 44 may be formed on a bottom surface 47 without the via 40, in some embodiments. The battery assembly 1 can further include the protective layer 48 that partially surrounds the battery assembly 1.

The first electrode material 10 can comprise an anode material (e.g., graphite, silicon, silicon graphite (Si—C), Lithium Titanium Oxide (LTO), etc.) and the second electrode material 20 can comprise a cathode material (e.g., Lithium Nickel Cobalt Aluminum Oxide (NCA), Lithium Manganese Oxide (LMO), Lithium Iron Phosphate (LFP), Lithium Cobalt Oxide (LCO), Lithium Nickel Manganese Cobalt Oxide (NMC), etc.). The electrode materials 10, 20 can also include additives, such as carbon black, carbon nanotubes and/or graphene to increase the electrical conductivity. It should be understood that the first electrode material 10 can be the cathode material and the second electrode material 12 can be the anode material in alternative embodiments. In some embodiments, the first and second electrode materials 10, 20 can be disposed into first and second cavities 13, 23 of the first and second substrate sections 14, 24 by way of screen-printing. The first and second electrode materials 10, 20 can initially be in a liquid, gel, and/or powder form when being disposed in the first and second sections 14, 24. After disposing the electrode materials 10, 20, the electrode materials 10, 20 can remain in the same form as they were disposed and/or altered to a different form (e.g., cured from a liquid form to a solid form). In some embodiments, a neutron-proton (N/P) ratio of the electrode materials 10, 20 can be a factor in designing the battery assembly 1. For example, a proper N/P ratio can provide a better first cycle efficiency and/or a better cycling performance than an improper N/P ratio. For example, a proper N/P ratio can provide a faster activation process (or formation process) of the battery assembly 1 than an improper N/P ratio. Amounts of the first and second electrode materials 10, 20 can alter an electrical charging capacity of the battery assembly.

In some embodiments, first and second cavities 13, 23 can be formed by etching sections of the first and second substrates 12, 22 of FIG. 1. In such embodiments, the non-conductive material 18 and the first current collector 36 (for the first section 14) or the second current collector 38 (for the second section 24) can partially define the first substrate section 14 and the second substrate section 24. In some embodiments, the cavities 13, 23 can be formed by other processes, such as, for example, by laser drilling. In some embodiments, the non-conductive material 18 of the substrates 12, 22 can comprise, for example, polyimide, Polyether Ether Ketone (PEEK), polyester, etc.

The ionically conductive material 30 can serve as an electrolyte between the first electrode 10 and the second electrode 20. The ionically conductive material 30 can comprise any suitable type of material that is ionically conductive, such as Styrene Butadiene Rubber (SBR) with Carboxymethylcellulose (CMC), Polyvinylidene Fluoride (PVDF), Polyethylene oxide (PEO), etc. In some embodiments, the ionically conductive partition 32 can comprise Lithium salt, such as Lithium Perchlorate ($LiClO_4$), Lithium Trifluoromethanesulfonate ($LiCF_3SO_3$), Lithium Hexafluorophosphate ($LiPE_6$), Lithium Tetrafluoroborate ($LiBF_4$), Lithium Bis(trifluoromethylsulfonyl)imide ($Li(CF_3SO_2)_2N$)). In some embodiments, the ionically conductive partition 32 can have a porous configuration that has pores allowing ions to pass through. Areas of the ionically conductive material that abut the first and second electrode materials 10, 20 may affect an output voltage of the battery assembly. In some embodiments, a narrower separation by the ionically conductive material 30 between the first electrode material 10 and the second electrode material 20, as opposed to a wider separation, can provide a shorter ion diffusion distance, which may provide a better transportability of the ions between the first electrode material 10 and the second electrode material 20.

The first substrate 12 (including the first substrate section 14) can be adhered with the second substrate 22 (including the second substrate section 24) by the adhesive 34. In some embodiments, the adhesive 34 can be disposed at various portions between the first and second substrates 12, 22 to attach the substrates 12, 22 to one another. The adhesive 34 can comprise any suitable type of adhesive, including any kind of modified epoxy or thermoset adhesive film reinforced with fibers. For example, the adhesive 34 can comprise, an Ajinomoto Build-up Film (ABF), Dupont FR0100 bonding film, epoxy, cyanide ester, cast polypropylene and/or acrylic adhesive. ABF can comprise about 9 wt % of Bisphenol-A epoxy resin, under 5 wt % of petroleum naphtha, about 1.1 wt % of cyclohexanone, about 0.5 wt % of N, N-dimethylformamide, under 5 wt % of toluene, under 5 wt % of ethanol, under 5 wt % of methyl ethyl ketone, and 30 to 40 wt % of silica powder. Dupont FR0100 bonding film can comprise 10 to 20 wt % of ethylenebis and 1 to 10 wt % of antimony trioxide. The adhesive 34 not only serves to adhere the first and second substrates 12, 22, but it can also serve to partially define the chamber 32 for the ionically conductive material 30. In some embodiments, the adhesive 34 and the ionically conductive material 30 can define a partition layer 35. In some embodiments, the partition layer 35 may include a spacer between the ionically conductive material 30 and the adhesive 34, so long as the adhesive 34 securely adheres the first and second substrates 12, 22.

In some embodiments, the current collectors 36, 38 can comprise traces embedded in the first and second substrates 12, 22. The current collectors 36, 38 illustrated in FIG. 1 are formed along a top side of the first electrode material 10 and a bottom side of the second electrode material 20, respectively. However, the current collectors 36, 38 can be disposed anywhere so long as the first current collector 36 is in contact with the first electrode material 10 and the second current collector 38 is in contact with the second electrode material 20. In some embodiments, the current collectors can be flexible. In some embodiments, the first and/or second current collectors 36, 38 can have a plurality of bends and/or curves to be flexible. In some embodiments, to increase surface area and maximize contact with the electrode materials 10, 20, the collectors 36, 38 can include elongate elements in patterns, such as spirals. The first and second current collectors 36, 38 can comprise copper, gold, aluminum, copper with anti-corrosion plating, copper with aluminum foil attached and/or any other suitable conductive material for collecting current in the electrode materials 10, 20. For example, in an embodiment where the first electrode material 10 is an anode material and the second electrode material 20 is a cathode material, the first current collector 36 can comprise copper and the second current collector 38 can comprise aluminum. The current collectors 36, 38 collect current from the electrode materials 10, 20 and guide the current to the terminals 42, 44.

The via 40 as shown in FIG. 1 guides current collected by the second current collector 38 near the bottom surface 47 to the second terminal 44 on the top surface 46. The via 40 can be formed by, for example, etching and/or drilling (e.g., laser drilling) through portions of the first and second substrates 12, 22 and the adhesive 34, thereby making a cavity, and disposing a conductive metal that makes an electrical contact with the second current collector 38 into the cavity.

In some embodiments, the first and second terminals 42, 44 can be formed on the first and second current collectors 26, 38. In some embodiments, the first and second terminals 42, 44 are exposed on the top surface 46 as illustrated, for example, in FIG. 1. Such embodiments can be beneficial because an electrical device can be integrated with the battery assembly 2 on the top surface 46. Areas of the first and second terminals 42, 44 that are exposed to on the top surface 46 can be adjusted by the protective layer 48.

The protective layer 48 can be disposed at least partially around the battery assembly 1. In some embodiments, the protective layer 48 can protect the battery assembly 1 against oxidation. In some embodiments, the protective layer can prevent solder pads, which may be disposed at the terminals 42, 44 to connect the battery assembly 1 with the electrical device, from forming a solder bridge. In some embodiments, the protective layer 48 can be, for example, a solder mask. For example, the solder mask can comprise NPR-90, NPR-3300, AUS21, etc.

The battery assembly 1 has a thickness T, as shown in FIG. 1. The thickness T can be, for example, in a range of 50 microns to 500 microns, in a range of 50 microns to 200 microns, in a range of 200 microns to 500 microns, or in a range of 100 microns to 200 microns.

Figure 3:
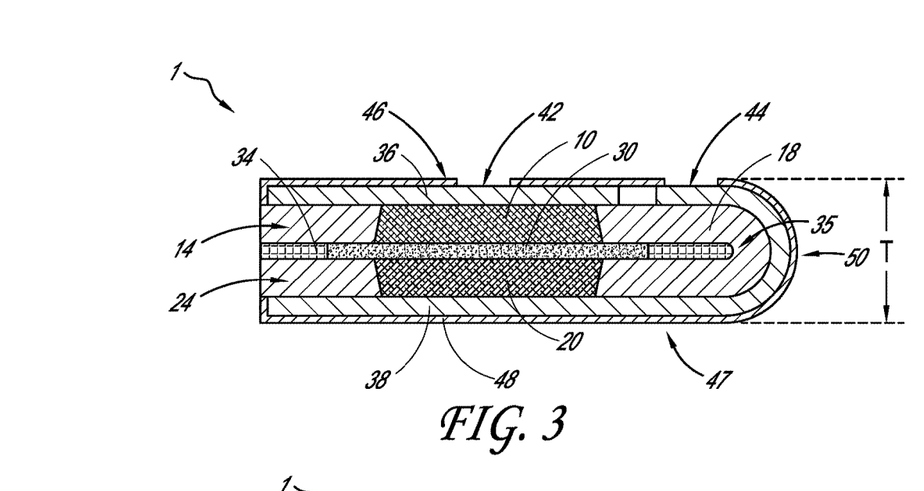
FIG. 3 is a schematic cross-sectional view of the battery assembly, according to another embodiment.
Figure 4:
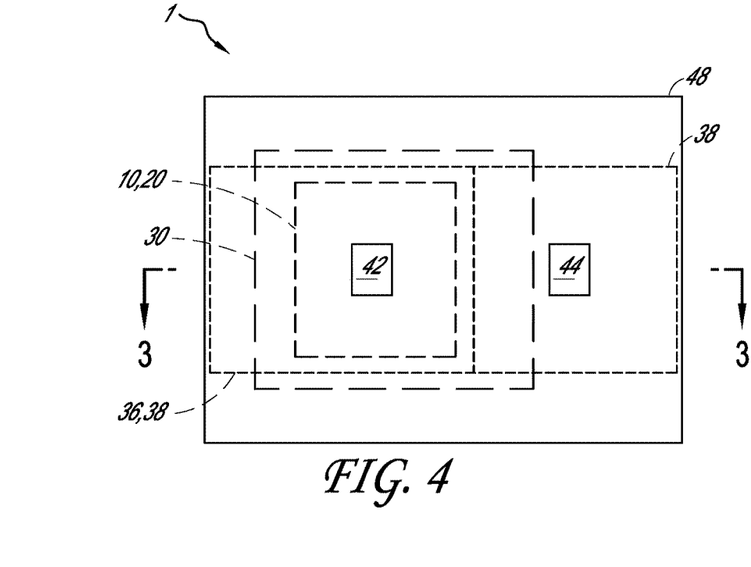
FIG. 4 is a schematic top plan view of the battery assembly of FIG. 3.

FIG. 3 is a schematic cross-sectional view of the battery assembly 1, according to another embodiment. FIG. 4 is a schematic top plan view of the battery assembly 1 of FIG. 3 with a first electrode material 10, a second electrode material 20, an ionically conductive material 30, a first current collector 36, a second current collector 38, and a protective layer 48 illustrated with hidden lines (a non-conductive material 18 is not shown). Unless otherwise noted, the components of FIGS. 3 and 4 may be the same as or generally similar to like-numbered components of FIGS. 1 and 2. Unlike the battery assembly 1 shown in FIG. 1 where the first and second substrate sections 14, 24 are disposed on two separate substrates 12, 22, in the battery assembly 1 illustrated in FIG. 3, the first and second substrate sections 14, 24 are disposed on a single substrate 50. The single substrate can be folded between the first and second substrate sections 14, 24. Also, the battery assembly 1 of FIG. 3 as illustrated does not include a separate via, such as the via 40 shown in FIG. 1, because the second current collector 38 of FIG. 3 extends to act as the via 40 of FIG. 1 to provide the second terminal 44 on the top surface 46. In some embodiments, the battery assembly 1 can be flexible and/or bendable. In some other embodiments, the battery assembly 1 can be rigid. In some embodiments, the battery assembly 1 can be flexible and/or bendable during manufacture but can be rigid after assembling.

In some embodiments, the cavities 13, 23 can be formed on the substrate 50 before folding the substrate 50 between the first and second substrate sections 14, 24. The first section 14 can be defined at least in part by the first current collector 36, the non-conductive material 18, and the first electrode material 10. The second section 24 can be defined at least in part by the second current collector 38, the non-conductive material 18, and the second electrode material 20.

In some embodiments, first and second cavities 13, 23 can be formed by etching sections of the single substrate of FIG. 1. In such embodiments, the non-conductive material 18 and the first current collector 36 (for the first section 14) or the second current collector 38 (for the second section 24) can partially define the first substrate section 14 and the second substrate section 24. In some embodiments, the cavities 13, 23 can be formed by other processes, such as, for example, by laser drilling. In some embodiments, the non-conductive material 18 of the substrate 50 can comprise any kind of dielectric material, for example, polyimide, fluoropolymer, Polyether Ether Ketone (PEEK), polyester, Liquid Crystal Polymer (LCP), etc.

In some embodiments, the current collectors 36, 38 can comprise traces embedded in the single substrate 50. Similar to the current collectors 36, 38 of FIG. 1, the current collectors 36, 38 illustrated in FIG. 3 are formed along a top side of the first electrode material 10 and a bottom side of the second electrode material 20, respectively. However, the current collectors 36, 38 can be disposed anywhere so long as the first current collector 36 is in contact with the first electrode material 10 and the second current collector 38 is in contact with the second electrode material 20.

Figure 5:
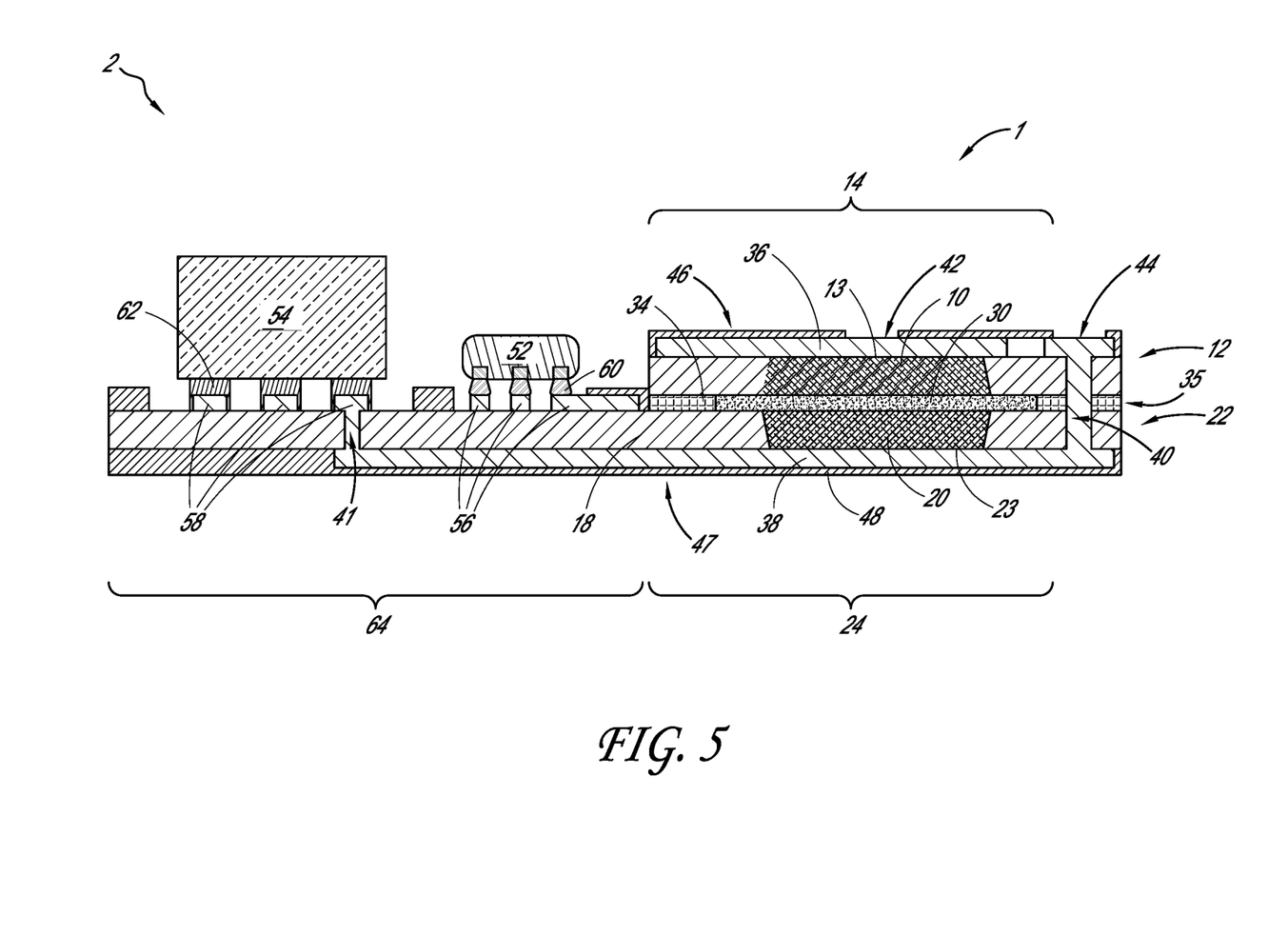
FIG. 5 is a schematic cross-sectional side view of an integrated device package comprising the battery assembly of FIG. 1 and electrical components, according to one embodiment.

FIG. 5 is a schematic cross-sectional side view of an integrated device package 2 that comprises a battery assembly 1 in one embodiment. Unless otherwise noted, the components of FIG. 5 may be the same as or generally similar to like-numbered components of FIGS. 1 to 4. The package substrate assembly of FIG. 5 includes the battery assembly 1 that is in electrical connection with a first electronic component 52 and a second electronic component 54.

In some embodiments, the first and second electrical components 52, 54 can be mounted on a third substrate section 64 of the second substrate 22 as shown in FIG. 5. In some embodiments, the first electrical component 52 can be electrically connected with the battery assembly 1 by a first plurality of conductive materials 56 (e.g., copper traces), corresponding first electrical interconnects 60 (e.g., solder balls) and the vias (not shown) extending from the first and second current collectors 36, 38. The second electrical component 54 can be electrically connected with the battery assembly 1 at least in part by a second plurality of conductive materials 58 (e.g., copper traces), corresponding second electrical interconnects 62 (e.g., solder balls), the via (not shown) extending from the first current collector 36, and a second via 41 extending from the second current collector 38.

There are two electrical components, the first and second components 52, 54, integrated with the battery assembly 1 in the integrated device package 2 shown in FIG. 5. However, there can be any number of electrical components integrated with the battery assembly 1. The first and second electrical components 52, 54 can comprise any suitable component, such as a sensor die, a light emitting diode (LED), an application specific integrated circuit (ASIC), a micro electromechanical systems (MEMS), etc. In some embodiments, for example, the first electrical component 52 can comprise a passive component and the second electrical component 54 can comprise an integrated circuit (IC).

Figure 6:
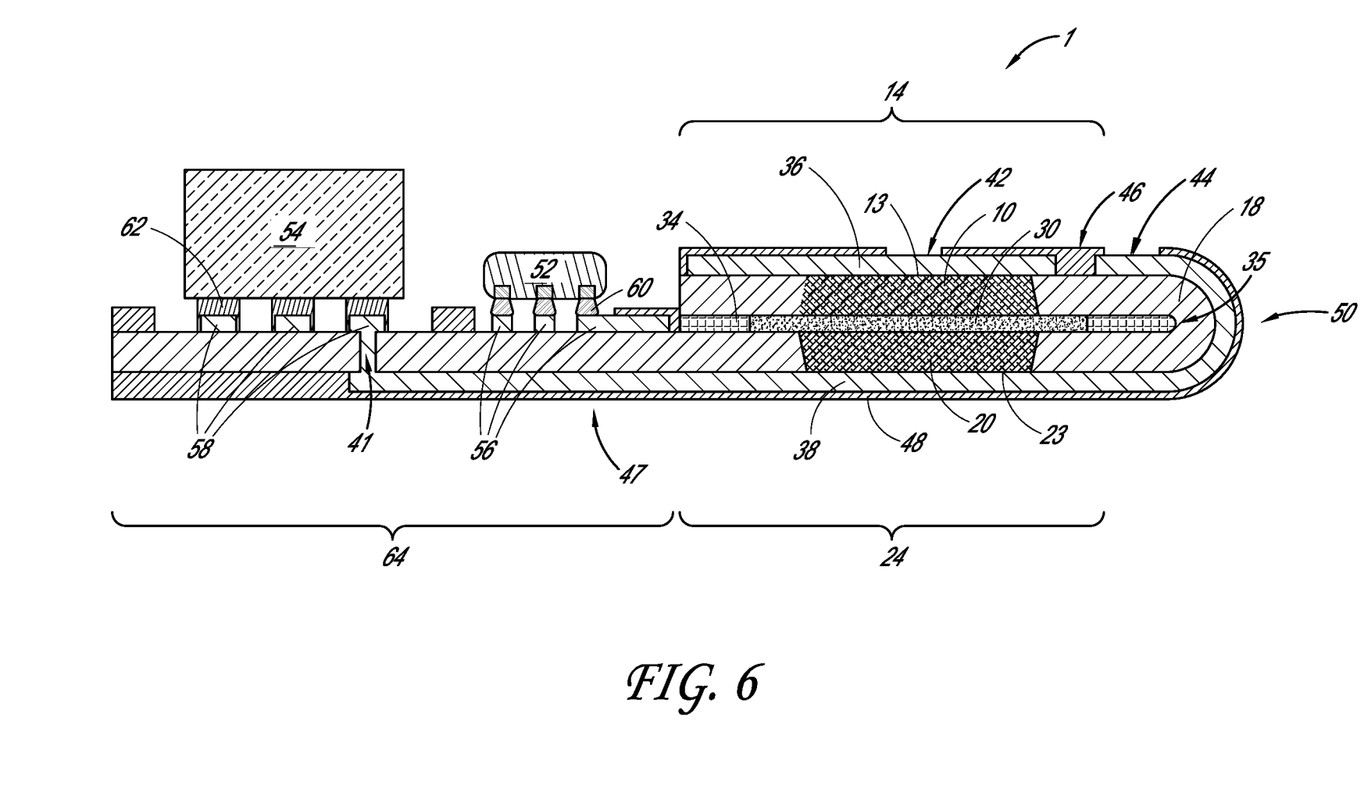
FIG. 6 is a schematic cross-sectional side view of the integrated device package comprising the battery assembly of FIG. 3 and electrical components, according to another embodiment.

FIG. 6 is a schematic cross-sectional side view of the integrated device package 2 in another embodiment. Unless otherwise noted, the components of FIG. 6 may be the same as or generally similar to like-numbered components of FIGS. 1 to 5. A difference between FIGS. 5 and 6 is that while the integrated device package 2 of FIG. 5 comprises the battery assembly 1 of FIG. 1, the integrated device package 2 of FIG. 6 comprises the battery assembly 1 of FIG. 3. In some embodiments, the first and second electrical components 52, 54 can be mounted on a third substrate section 64 of the substrate 50 as shown in FIG. 6.

Figure 7:
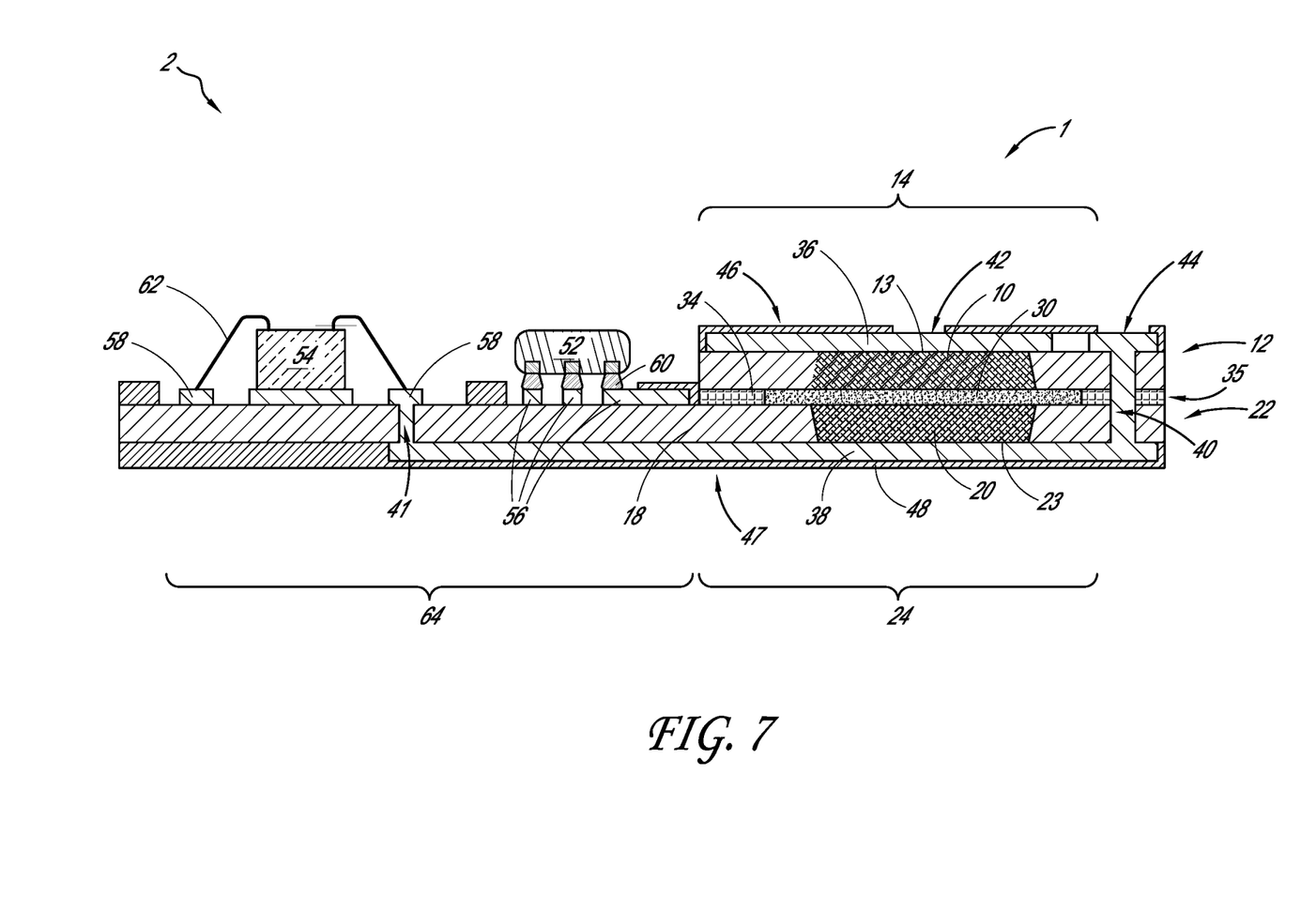
FIG. 7 is a schematic cross-sectional side view of the integrated device package comprising the battery assembly of FIG. 1 and electrical components, according to another embodiment.

FIG. 7 is a schematic cross-sectional side view of the integrated device package 2 in another embodiment. Unless otherwise noted, the components of FIG. 7 may be the same as or generally similar to like-numbered components of FIGS. 1 to 6. The second interconnects 62 shown in FIG. 5 can comprises solder balls to define a flip-chip bonding connection between the second electrical component 54 and the battery assembly 1 However, the second electrical interconnects 62 in FIG. 7 can comprise wires to define a wire bonding and/or ribbon bonding connection between the second electrical component 54 and the battery assembly 1. It should be understood that the second interconnects 62 between the second electrical component 54 and the battery assembly 1 can comprise any other suitable material.

Figure 8:
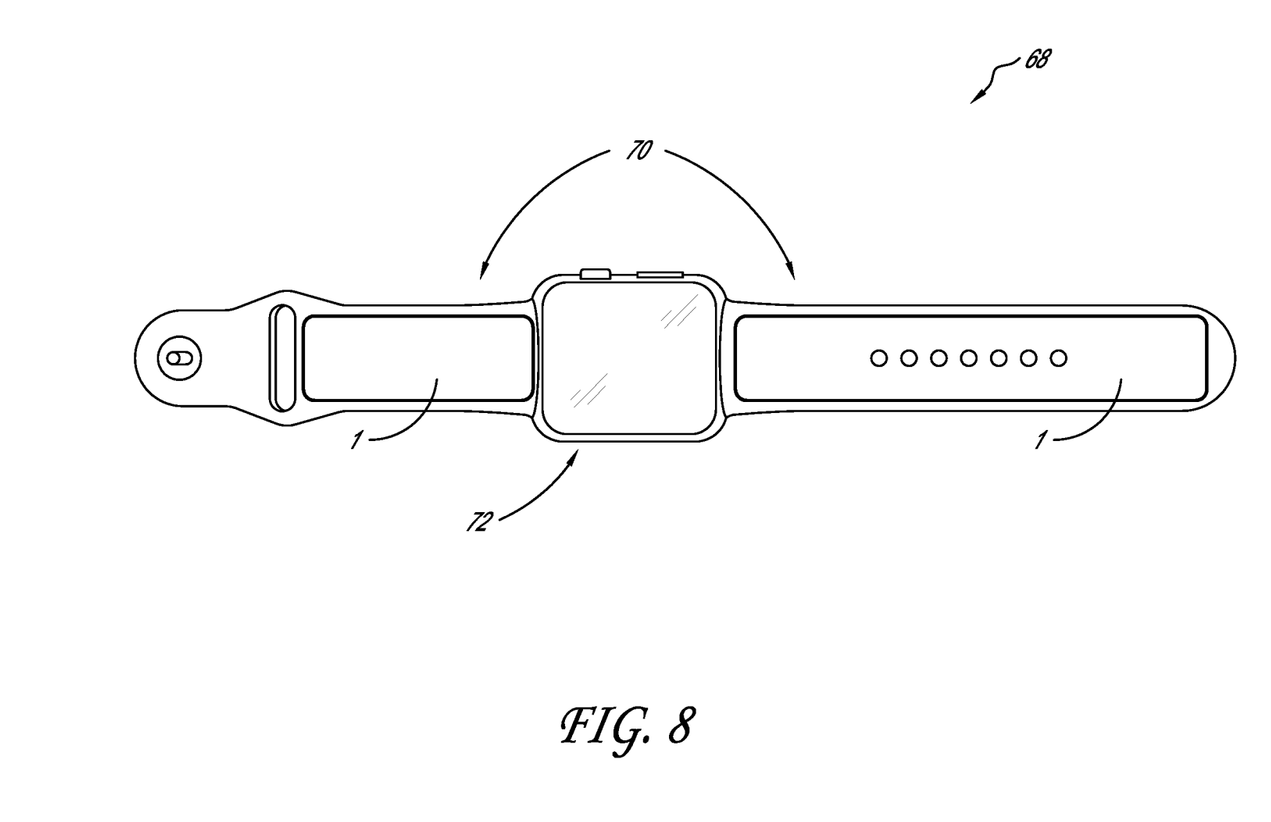
FIG. 8 is a schematic top plan view of a wristband device that integrates the battery assembly.

FIG. 8 is a schematic top plan view of a wristband device 68 that integrates the battery assembly 1 of any one of FIGS. 1-4. The wristband device 68 can comprise a belt portion 70 and a body portion 72. In some embodiments, the battery assembly 1 can be disposed in the belt portions 70 of the device 68. In some embodiments, the battery assembly 1 can be electrically connected to components in the body portion 72 by traces embedded in the belt portion 70 to supply current to the components in the body portion 72. Disposing the battery assembly 1 in the belt portions 70, instead of disposing in the body portion 72 of the device 68, may advantageously reduce a size of the body portion 72.

In some embodiments, for example, the wristband device 68 can operate as a watch, a heart rate monitoring system, a pedometer, etc. In some embodiments, for example, the components in the wristband device 68 can comprise a sensor, an accelerometer, a gyroscope, a MEMS device, etc.

In some embodiments, the battery assembly 1 can be integrated with other items. For example, the battery assembly 1 can be disposed in a card that comprises a Radio Frequency Identification (RFID) system. The battery assembly 1 can also be integrated with a flexible film display, a mobile phone, a wearable device (e.g., a smart clothing, wristband device and transdermal drug delivery patch), disposable devices, medical implants, etc.

Although this invention has been disclosed in the context of certain embodiments and examples, it will be understood by those skilled in the art that the present invention extends beyond the specifically disclosed embodiments to other alternative embodiments and/or uses of the invention and obvious modifications and equivalents thereof. In addition, while several variations of the invention have been shown and described in detail, other modifications, which are within the scope of this invention, will be readily apparent to those of skill in the art based upon this disclosure. It is also contemplated that various combinations or sub-combinations of the specific features and aspects of the embodiments may be made and still fall within the scope of the invention. It should be understood that various features and aspects of the disclosed embodiments can be combined with, or substituted for, one another in order to form varying modes of the disclosed invention. Thus, it is intended that the scope of the present invention herein disclosed should not be limited by the particular disclosed embodiments described above, but should be determined only by a fair reading of the claims that follow.

What is claimed is:

1. A battery assembly comprising:
a first electrode disposed in a first cavity of a first substrate section, the first cavity extends through a thickness of the first substrate section;
a second electrode disposed in a second substrate section;
an adhesive disposed between the first substrate section and the second substrate section, the adhesive bonding the first substrate section to the second substrate section, the adhesive having a first portion and a second portion spaced apart laterally from the first portion, the first portion and the second portion of the adhesive partially defining a chamber between the first and second electrodes; and
an electrolyte disposed in the chamber vertically between the first and second electrodes, the electrolyte disposed laterally between the first portion and the second portion of the adhesive.

2. The battery assembly of claim 1, further comprising a first current collector configured to collect current from the first electrode and a second current collector configured to collect current from the second electrode.

3. The battery assembly of claim 2, wherein the first current collector comprises a first terminal and the second current collector comprises a second terminal, the first and second terminals configured to connect to an electronic device.

4. The battery assembly of claim 1, wherein the first substrate section is formed on a flexible substrate.

5. The battery assembly of claim 1, wherein the first and second substrate sections comprise respective portions of a single substrate, wherein the single substrate is folded between the first and second substrate sections.

6. The battery assembly of claim 1, wherein the first substrate section forms part of a first substrate and the second substrate section forms part of a separate second substrate.

7. The battery assembly of claim 6, further comprises a via extending through the first and second substrates and the adhesive, wherein the via guides current from the second electrode to a different portion of the battery assembly.

8. The battery assembly of claim 1, further comprising a package substrate assembly having one or more conductive traces, the battery assembly being integrated within the package substrate assembly and electrically connected to a first conductive trace of the one or more conductive traces.

9. An integrated device package comprising the battery assembly of claim 8, further comprising an integrated device die mounted and electrically connected to the package substrate assembly.

10. The battery assembly of claim 1, wherein the electrolyte is screen printed in the chamber.

11. The battery assembly of claim 1, wherein the adhesive and the electrolyte are spaced by a spacer.

12. The battery assembly of claim 1, wherein the battery assembly has a thickness from a top surface to a bottom surface in a range of 50 microns to 500 microns.

13. The battery assembly of claim 1, wherein the battery assembly is at least partially covered with a protective layer.

14. A battery assembly comprising:
a first electrode disposed in a first substrate section;
a second electrode disposed in a second substrate section;
an adhesive disposed between the first substrate section and the second substrate section, the adhesive bonding the first substrate section to the second substrate section, the adhesive having a first portion and a second portion spaced apart laterally from the first portion, the first portion and the second portion of the adhesive partially defining a chamber between the first and second electrodes; and
an electrolyte disposed in the chamber vertically between the first and second electrodes, the electrolyte disposed laterally between the first portion and the second portion of the adhesive,
wherein the first and second substrate sections comprise respective portions of a single substrate, wherein the single substrate is folded between the first and second substrate sections.

15. The battery assembly of claim 14, further comprising a first current collector configured to collect current from the first electrode and a second current collector configured to collect current from the second electrode.

16. The battery assembly of claim 15, wherein the first current collector comprises a first terminal and the second current collector comprises a second terminal, the first and second terminals configured to connect to an electronic device.

17. The battery assembly of claim 14, wherein the first substrate section is formed on a flexible substrate.

18. The battery assembly of claim 14, wherein the adhesive and the electrolyte are spaced by a spacer.

19. The battery assembly of claim 14, wherein the battery assembly has a thickness from a top surface to a bottom surface in a range of 50 microns to 500 microns.

20. The battery assembly of claim 14, wherein the battery assembly is at least partially covered with a protective layer.

* * * * *